United States Patent [19]
Kado et al.

[11] Patent Number: 5,565,030
[45] Date of Patent: Oct. 15, 1996

[54] METHOD FOR THE PREPARATION OF A SUPERLATTICE MULTILAYERED FILM

[75] Inventors: Tetsuo Kado; Shigeyuki Yamamoto, both of Kure, Japan

[73] Assignee: Japan as represented by Director General of Agency of Industrial Science and Technology, Japan

[21] Appl. No.: 401,277

[22] Filed: Mar. 9, 1995

[30] Foreign Application Priority Data

Mar. 24, 1994 [JP] Japan ................................. 6-079729

[51] Int. Cl.$^6$ ........................................... C30B 25/18
[52] U.S. Cl. ............................ 117/89; 117/92; 117/105; 117/108; 117/109; 117/928
[58] Field of Search ............................ 117/89, 92, 105, 117/108, 109, 928

[56] References Cited

U.S. PATENT DOCUMENTS

| | | | |
|---|---|---|---|
| 4,576,699 | 3/1986 | Sato et al. | 204/192 M |
| 5,268,235 | 12/1993 | Lashmore et al. | 205/170 |
| 5,320,719 | 6/1994 | Lasbmore et al. | 205/104 |
| 5,366,815 | 11/1994 | Araki et al. | 428/611 |

OTHER PUBLICATIONS

Navinsek et al., "Sputter deposition of Multilayered Structures for Use in Sputter Depth Profile Calibration," Vaccum, vol. 36, No. 10 pp. 711–714, 1986.

Yamada et al. "Fabrication of Metal/Metaloxide Multi–Layered Film with Periodic Structure,", Shinku (1993), 36(6) pp. 559–562 Translated abs. only.

Fuchs et al, "Ion Bean Mixing of Silver–Magnesium–Oxide Multilayers", thin Solid Films, vol. 165(1988), pp. 347–358.

Kado, "Epitaxial Superlattice of AglN:O" Prepared on MgO(oci) Journal of Crystal Growth vol. 144 (1994) PP. 329–334.

*Primary Examiner*—Robert Kunemund
*Attorney, Agent, or Firm*—Wenderoth, Lind & Ponack

[57] ABSTRACT

A novel method is proposed for the preparation of a superlattice multilayered film, which has a multilayered structure alternately consisting of epitaxially grown layers of a metal and layers of a metal oxide formed on the surface of a substrate and is useful as high-speed electronic devices, soft X-ray reflectors, neutron beam polarizers and the like. According to the discovery leading to this invention, good epitaxial growth of the layers can be accomplished when the metal has a face-centered cubic lattice structure and the metal oxide has a sodium chloride-type cubic lattice structure and the difference in the lattice constant between the metal and the metal oxide is small enough as in the combinations of silver and nickel oxide or magnesium oxide and nickel and nickel oxide.

8 Claims, 2 Drawing Sheets

METHOD FOR THE PREPARATION OF A SUPERLATTICE MULTILAYERED FILM

BACKGROUND OF THE INVENTION

The present invention relates to a method for the preparation of a superlattice multilayered film or, more particularly, to a method for the preparation of a superlattice multilayered film formed by the alternating epitaxial growth of layers of a metal and layers of a metal oxide. The superlattice multilayered film prepared according to the inventive method is a functional member having usefulness, or example, as a high-speed electronic device such as transistors and the like, reflector for soft X-rays and neutron beam polarizer.

It is accepted that a superlattice multilayered film is a promising new functional member because, as a consequence of the alternately layered structure thereof consisting of layers of a metal and layers of a metal oxide each having a thickness of an atomic order, the phenomenon of interference or diffraction is caused therein with material waves such as electron waves and neutron waves or electromagnetic waves such as X-rays and far-ultraviolet light so that novel functional performance based on these wave phenomena can be effectively derived beyond the characteristics of the individual metal and metal oxide. Various proposals and attempts have been made heretofore for the preparation of a superlattice multilayered film alternately consisting of layers of a metal and layers of a metal oxide. For example, a superlattice multilayered film consisting of a combination of iron or nickel and silicon oxide is proposed in Solid State Communications, volume 26, page 95 (1978) by Sato, et al. while a superlattice multilayered film consisting of nickel and titanium oxide is reported in Application of Surface Science, page 640 (1985) by H. Nozoye, et al and that consisting of nickle and nickel oxide is disclosed in Shinku (Vacuum), volume 36, page 559 (1993) by Yamada, et al.

In each o the superlattice multilayered films of the prior art mentioned above, however, no definite relationship of crystallographic orientation is found between adjacent two layers of, one, a layer of the metal and, the other, a layer of the metal oxide or, in other words, the superlattice multilayered film has a non-epitaxial layered structure so that the junction interface between the layers is microscopically not always flat enough and each of the layers contains a very large number of defects such as grain boundaries and dislocations therein. These defects in the layers are responsible for the scattering or phase shift of electromagnetic waves so that the desired functional performance based on the wave phenomenon cannot be derived effectively therefrom. In electronic devices, in particular, no method is known in the prior art for obtaining an epitaxially multilayered film structure consisting of a metal and an oxide leading to factual obsolescence of the once very promising idea of electronic devices of such a structure behind the flourishing progress of semiconductor devices.

SUMMARY OF THE INVENTION

The present invention accordingly has an object to provide a method for the preparation of a superlattice multilayered film by which an epitaxially multilayered film keeping a definite relationship in the crystallographic orientation between adjacent layers can be continuously formed by overcoming the problems and disadvantages in the prior art methods or, in particular, a method for the preparation of a superlattice multilayered film of which the interlayer junction surface has high flatness and each of the layers contains a very small number of defects such as grain boundaries and dislocations not to cause scattering and phase shift of electromagnetic waves so that the functional performance based on a wave phenomenon can be efficiently derived.

Thus, the method of the present invention for the preparation of a superlattice multilayered film comprises the step of:

forming, on the surface of a substrate, at least three layers alternately consisting of layers of a metal having a crystallographic structure of a face-centered cubic lattice with a first lattice constant $\lambda_1$ and layers of a metal oxide having a crystallographic structure of a sodium chloride-type cubic lattice with a second lattice constant $\lambda_2$, the difference between $\lambda_1$ and As being smaller than 19% based on either of $\lambda_1$ and $\lambda_2$ which is smaller than the other, one on the other by the vacuum film-forming method for epitaxial growth of the layers.

The above mentioned requirements for the crystallographic structures of the metal and metal oxide to be combined as well as for the difference in the lattice constants therebetween can be met particularly satisfactorily when the metal is silver and the metal oxide is nickel oxide or magnesium oxide or when the metal is nickel and the metal oxide is nickel oxide.

DETAILED DESCRIPTION OF THE PREFERRED EMBODIMENTS

Figure 1:
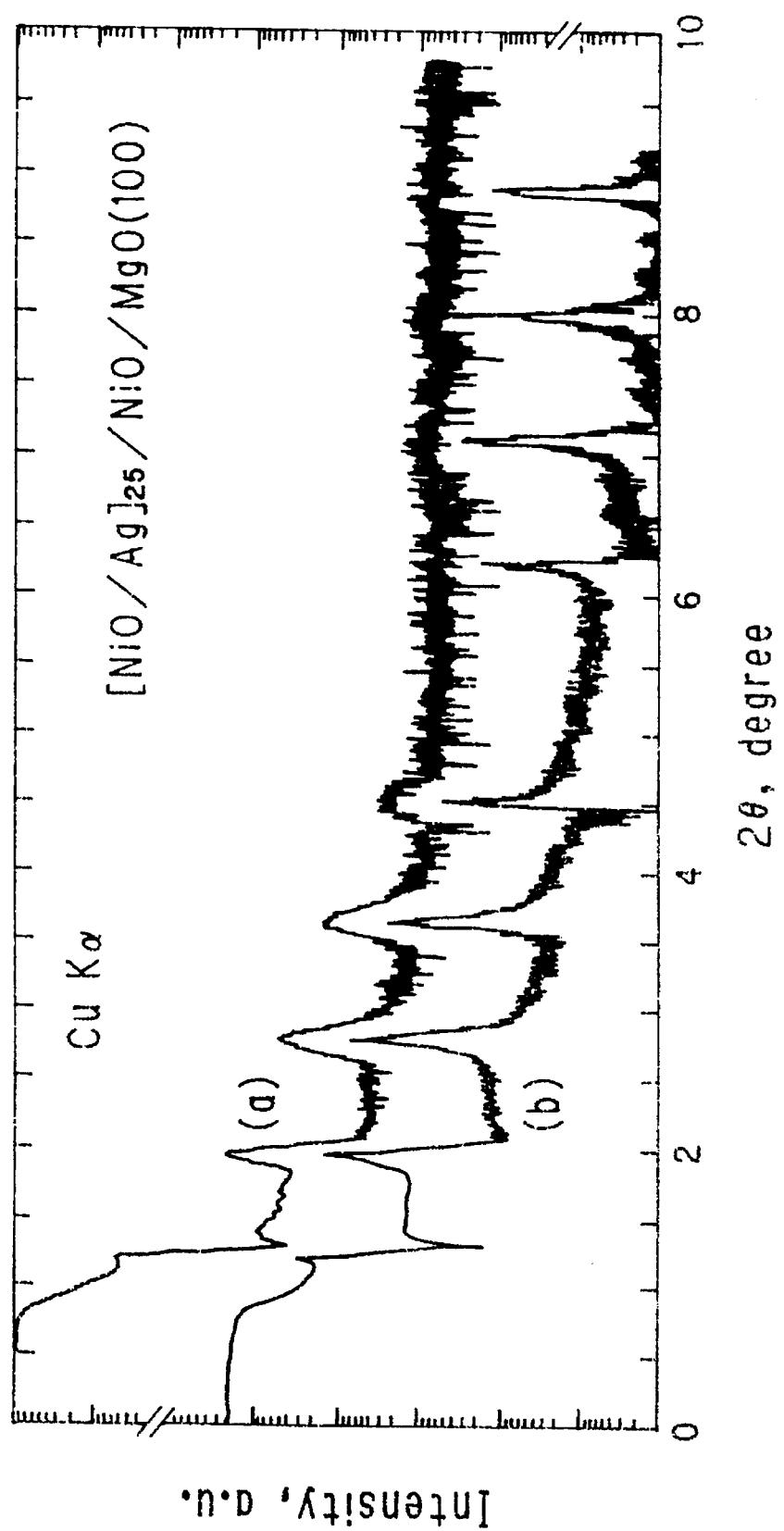
FIG. 1 is an X-ray diffractometric diagram showing a pattern for the multilayered structure of the superlattice multilayered film prepared in Example 1.

As is described above, the superlattice multilayered film according to the method of the present invention is prepared by the alternate epitaxial growth of layers of a metal and layers of a metal oxide one on the other on the surface of a substrate by the method of vacuum film formation. The inventors' discovery leading to the present invention is that the desired epitaxial growth of the layers takes place when and only when the metal and metal oxide as the starting materials satisfy the above mentioned specific requirements for their crystallographic structures and the difference between the lattice constants thereof.

Namely, the metal as one of the starting materials must have a crystallographic structure of a face-centered cubic lattice while the metal oxide to be combined with the metal ust have a crystallographic structure of a sodium chloride-type cubic lattice. Further, it is essential in order to accomplish epitaxial growth of the layers one on the other that the difference in the lattice constants between the two starting materials, referred to as the degree of mismatching hereinafter, is smaller than 19% or, preferably, smaller than 5% or, more preferably, smaller than 3% based on either of the lattice constants of the metal and metal oxide which is smaller than the other. When the degree of mismatching is too large, growth of each of the layers does not proceed epitaxially.

These requirements are satisfied by the following combinations of a metal and a metal oxide including: silver/nickel oxide; gold/nickel oxide; nickel/nickel oxide; aluminum/nickel oxide; silver/magnesium oxide; gold/magnesium oxide; aluminum/magnesium oxide; gold/cobalt oxide; and gold/iron oxide, of which the combination of silver and nickel oxide is particularly satisfactory.

In the method of the present invention, at least three layers of the above mentioned metal and metal oxide are alternately formed on the surface of a substrate by a vacuum film-forming method which is preferably the method of electron-beam vapor-deposition, laser ablation or sputtering though not particularly limitative thereto.

The substrate, on which the above mentioned alternate layers of a metal and a metal oxide are formed, should be a plate of a single crystal such as sapphire and magnesium oxide. The substrate is used preferably after baking at 250° C. C. or higher in order to remove the adsorbed moisture. It is preferable that, prior to the formation of the first layer consisting of either the metal or the metal oxide, an underlayer is formed on the substrate surface which serves to improve the surface condition of the substrate with increased flatness of the substrate surface and also serves to remove or mitigate mismatching between the substrate surface and the first layer of the multilayered structure. The material of the underlayer must have good compatibility with the substrate surface for epitaxial growth and must be free from mismatching with the first layer of the multilayered structure so that it is selected depending on the materials of the substrate and the first layer of the multilayered structure. In particular, the material of the first layer in the superlattice multilayered structure may serve as the material of the underlayer when the first layer is formed to have a sufficiently large thickness. When alternate layers of silver and nickel oxide are to be formed alternately on the surface of the substrate of a magnesium oxide single crystal, for example, either silver or nickel oxide can be used as a material of the underlayer when the first layer is formed from silver or nickel oxide, respectively. The method for the formation of an underlayer naturally depends on the material thereof as well as the substrate and the first layer. When a silver/nickel oxide superlattice multilayered film is to be formed on a magnesium oxide substrate with the first layer being formed from nickel oxide, for example, a relatively thick layer of nickel oxide having a thickness of 20 nm or larger is first formed on the substrate surface at a temperature of 100° to 550° C. followed by annealing at 600° to 650° C. for 5 to 15 minutes.

The process of film formation for the multilayers is performed in an atmosphere of vacuum under a pressure not exceeding $10^{-6}$ Pa for a metal and not exceeding $10^{-5}$ Pa for a metal oxide. It is important to prevent interlayer diffusion between layers of a metal and a metal oxide by conducting the film-forming process at a relatively low temperature not higher than 150° C. or, preferably, not exceeding 50° C. or, more preferably, around 0° C. At this temperature, deposition of the starting materials of a metal and metal oxide proceeds in the form of molecular beams. A preferable apparatus for the deposition is an apparatus for molecular-beam epitaxial-growth (MBE) equipped with an electron-beam vapor-deposition unit although apparatuses for sputtering and laser ablation can be used.

The velocity of film formation should not be too large in order to accomplish good epitaxial growth of the layers. For example, the velocity should not exceed 0.3 nm/second or, preferably, 0.03 nm/second in the electron-beam vapor-deposition method. It is preferable that each of the epitaxially grown multilayers has a thickness in the range from 0.4 to 10 nm, though not particularly limitative thereto.

In the following, the method of the present invention is illustrated in more detail by way of examples, which, however, never limit the scope of the invention in any way.

EXAMPLE 1

The starting materials for the preparation of a super-lattice multilayered film used here according to the invention were silver having a face-centered cubic lattice structure and nickel oxide having a sodium chloride-type cubic lattice structure, of which the lattice constants were 0.40862 nm and 0.41684 nm, respectively, with a degree of mismatching of 2.0%. The substrate was a 20 mm by 20 mm wide square plate of single crystal magnesium oxide having a thickness of 0.8 mm, of which the flat surfaces had a crystallographic orientation of (001).

After an ultrasonic cleaning treatment successively in acetone, ethyl alcohol and ultra-pure water and a baking treatment by heating at 600° C. in an atmosphere of ultra-high vacuum, an underlayer of nickel oxide as a buffering layer having a thickness of 20 nm was formed on the surface of the substrate plate by the electron-beam vapor-deposition method at 500° C. and subjected to aging by keeping at a temperature of 615° C. for 5 minutes. On the thus treated underlayer of nickel oxide, 25 layers of silver each having a thickness of 8.3 nm and 25 layers of nickel oxide each having a thickness of 1.7 nm were alternately formed by the method of electron-beam vapor-deposition at a temperature of 0°C., the layer of silver being the first of the layers deposited on the underlayer. The pressure of the vacuum atmosphere was $10^{-6}$ Pa and $10^{-5}$ Pa and the velocity of film formation was 0.1 nm/second and 0.01 nm/second for the deposition of the silver layers and nickel oxide layers, respectively.

The pattern of high-energy electron diffraction taken at any stage of the film had a strong streak pattern indicating epitaxial growth of the layers and the pattern was perfectly reproducible even after formation of 50 silver layers and 50 nickel oxide layers. The pattern (a) in FIG. 1 of the accompanying drawing is a reproduction of the X-ray diffraction pattern of the multilayered film consisting of 25 silver layers and 25 nickel oxide layers, in which five superlattice reflections were found at low angles. Good coincidence could be obtained between the pattern (a) and the pattern (b) which shows the results of the calculation according to a dynamical model. The thus obtained multilayered film was found to be a single crystal as is shown by the examination of the cross section thereof by a transmission electron microscope.

Figure 2:
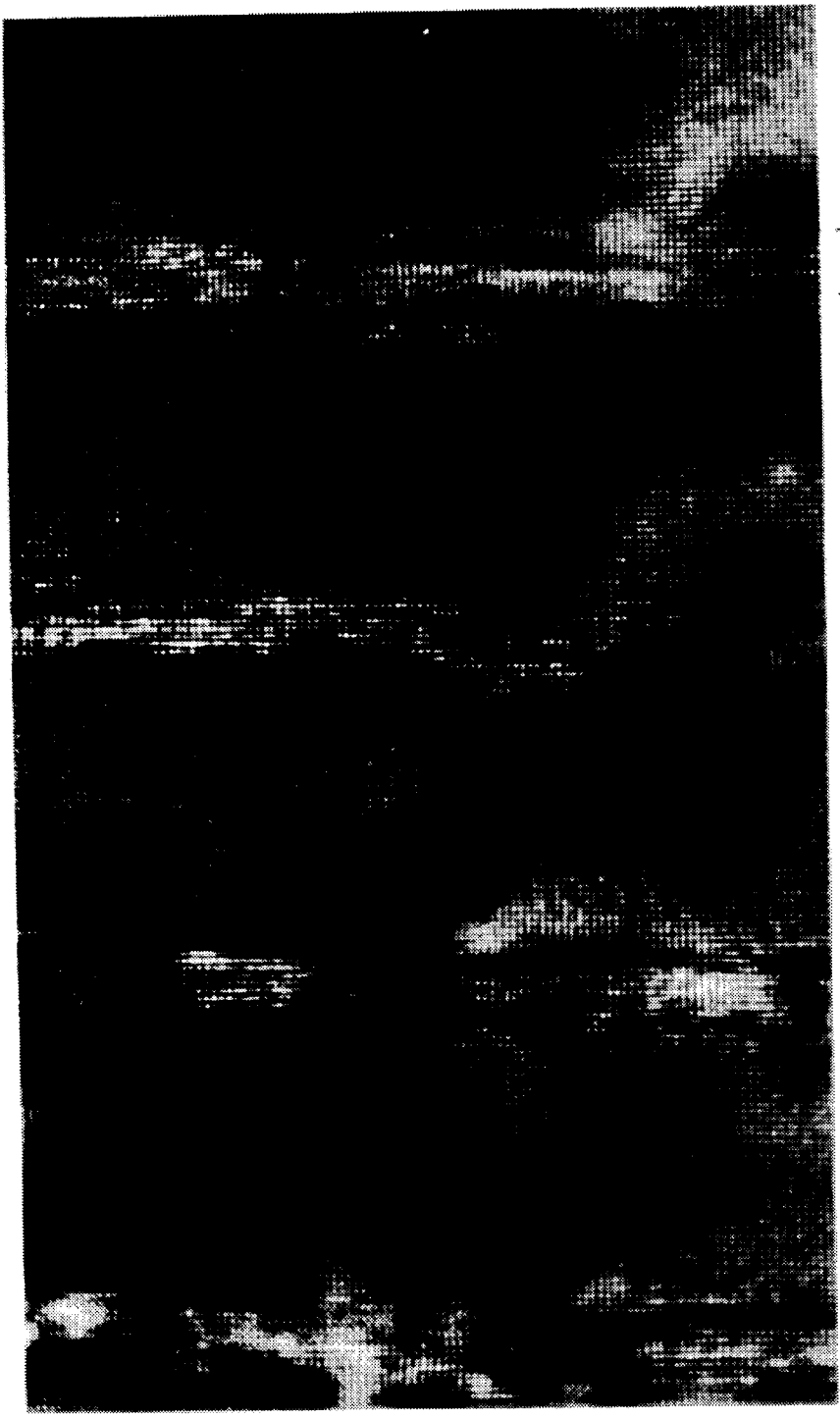
FIG. 2 is a high-resolution electron diffraction pattern showing the layered structure of a superlattice multilayered film prepared in Example 1.

FIG. 2 is a high-resolution electron diffraction pattern of a cross section of the multilayered film after formation of 25 silver layers and 25 nickel oxide layers, which indicates orderly arrangement of the atoms in the cross section penetrating the layers.

The above described experimental results support the conclusion that the thus prepared multilayered film has an epitaxial superlattice structure with orderly arrangement of the atoms within each of the layers.

EXAMPLE 2

The procedure for the preparation of a superlattice multilayered film was about the same as in Example 1 except that the multilayers were formed from a combination of silver and magnesium oxide having a sodium chloride-type cubic lattice structure with a lattice constant of 0.42112 nm. The degree of mismatching was 3.1%. Each of the silver layers had a thickness of 4.0 nm and each of the magnesium oxide layers had a thickness of 2.0 nm. The pressure of the vacuum atmosphere was $10^{-7}$ Pa and $10^{-6}$ Pa and the velocity of film formation was 0.03 nm/second and 0.05 nm/second for the deposition of the silver layers and magnesium oxide layers, respectively.

While a strong streak pattern indicating epitaxial growth of the layers was found in the high-energy electron diffraction pattern taken at the early stage of the film formation, the pattern was transformed into a spot-like pattern as the number of the deposited layers was increased and the spot was further transformed into an arc-like spot and then into a halo ring after formation of 12 silver layers and 12 magnesium oxide layers. Appearance of a spot suggested that the thus formed multilayers had an epitaxially grown single crystal structure and that the surface had substantial ruggedness. Incipient appearance of a halo ring was noted after formation of about 26 silver layers and 26 magnesium oxide layers together with a spots while the halo ring was strong and the spot was very weak after formation of 40 silver layers and 40 magnesium oxide layers. These results indicated that, although the epitaxial growth of the layers proceeded smoothly up to the formation of 12 layers each of the silver and magnesium oxide layers, gradual transfer took place from the epitaxial growth to non-epitaxial growth with an intermediate stage of concurrent occurrence of the epitaxial growth and non-epitaxial growth. The X-ray diffraction pattern of the multilayered film after formation of 40 layers each of the silver and magnesium oxide layers indicated four or more of superlattice reflections at low angles.

EXAMPLE 3

A superlattice multilayered film was prepared on a single crystal sapphire plate of 20 mm by 20 mm by 0.8 mm dimensions from nickel metal of a face-centered cubic lattice structure having a lattice constant of 0.35239 nm and nickel oxide. The degree of mismatching was 18.3%.

The procedure for the preparation of the superlattice multilayered film was about the same as in Example 1 excepting the use of the above mentioned substrate plate and combination of the starting materials and the temperature of the substrate, at which deposition of the layers by the electron-beam vapor-deposition method was performed, of 25 C. instead of 0° C. Each of the nickel layers and each of the nickel oxide layers had a thickness of 5.0 nm and 3.0 nm, respectively. The pressure of the vacuum atmosphere was $10^{-7}$ to $10^{-6}$ Pa and $10^{-6}$ to $10^{-5}$ Pa and the velocity of film formation was 0.03 nm/second and 0.01 nm/second for the deposition of the nickel layers and nickel oxide layers, respectively.

The high-energy electron diffraction pattern was spot-like already by the deposition of the first layers of nickel and nickel oxide and the spots were gradually expanded as the number of the layers was increased. Expansion of the spots suggested that the layers, even though single-crystalline, had relatively low crystallinity. Incipient appearance of a halo ring was noted after formation of 11 layers each and the halo ring pattern was complete after formation of 18 layers each. The X-ray diffraction pattern of the multilayered film after formation of 40 layers each of nickel and nickel oxide indicated three or more of superlattice reflections at low angles.

What is claimed is:

1. A method for the preparation of a superlattice multilayered film which comprises the step of:

forming, on the surface of a substrate which is a plate of sapphire or a single crystal of magnesium oxide, at least three layers alternately consisting of layers of metallic silver having a crystallographic structure of a face-centered cubic lattice with a first lattice constant $\lambda_1$ and layers of nickel oxide or magnesium oxide having a crystallographic structure of a sodium chloride-type cubic lattice with a second lattice constant $\lambda_2$, the difference between $\lambda_1$ and $\lambda_2$ being smaller than 19% based on either of $\lambda_1$ and $\lambda_2$ which is smaller than the other, one on the other by a vacuum film-forming method for epitaxial growth of the layers, each layer having a thickness in the range of from 0.4 to 10 nm.

2. The method as claimed in claim 1 in which the metal oxide is nickel oxide.

3. The method as claimed in claim 1 in which the vacuum film-forming method is a method of electron-beam vapor deposition.

4. The method as claimed in claim 1 in which the temperature at which the layers are formed by the vacuum film-forming method is not higher than 150° C.

5. The method as claimed in claim 1 in which the pressure of the atmosphere under which the layers are formed by the vacuum film-forming method is not higher than $10^{-6}$ Pa for the layers of the metal and not higher than $10^{-5}$ Pa for the layers of the metal oxide.

6. The method as claimed in claim 1 in which the velocity at which the layers are formed by the vacuum film-forming method does not exceed 0.3 nm/second.

7. The method as claimed in claim 1 in which the difference between $\lambda_1$ and $\lambda_2$ is smaller than 5% based on either of $\lambda_1$ and $\lambda_2$ which is smaller than the other.

8. The method as claimed in claim 7 in which the difference between $\lambda_1$ and $\lambda_2$ is smaller than 3% based on either of $\lambda_1$ and $\lambda_2$ which is smaller than the other.

* * * * *